United States Patent [19]

Kataoka et al.

[11] Patent Number: 5,118,386
[45] Date of Patent: Jun. 2, 1992

[54] PRINTED CIRCUIT BOARD HAVING BUMPS AND METHOD OF FORMING BUMPS

[75] Inventors: Tatsuo Kataoka, Kawaguchi; Yutaka Iguchi, Urawa, both of Japan

[73] Assignee: Mitsui Mining & Smelting Co., Ltd., Tokyo, Japan

[21] Appl. No.: 452,198

[22] Filed: Dec. 18, 1989

[30] Foreign Application Priority Data

May 26, 1989 [JP] Japan .................. 1-131558

[51] Int. Cl.⁵ .................................. H01L 21/00
[52] U.S. Cl. ........................... 156/656; 427/98; 156/659.1; 174/254; 174/267
[58] Field of Search ............. 156/659.1, 656; 427/98; 174/254, 267

[56] References Cited

U.S. PATENT DOCUMENTS 4,790,902  12/1988  Wada et al. ................ 156/659.1
4,878,990  11/1989  Dugan et al. ............... 156/659.1

OTHER PUBLICATIONS

"The Multilayer Printed Circuit Board Handbook", ed. by J. A. Scarlett, pp. 111-115; 450-453; ©1985.
"Handbook of Printed Circuit Manufacturing", by Raymond H. Clarke, pp. 5-6, ©1985.

Primary Examiner—David A. Simmons
Assistant Examiner—George Gondreau
Attorney, Agent, or Firm—Bucknam and Archer

[57] ABSTRACT

A printed circuit board having a plurality of bumps that serve for connection terminals, the bumps being formed by covering the printed circuit except portions where the bumps are to be formed, applying an electroplating onto the uncovered bump-forming portions on the printed circuit maintaining a thickness nearly equal to that of the covering, applying thereon a non-electrolytic plating and electroplating on the whole surface from the surfaces of the bump-forming portions to the surfaces of the covered portions, and removing the platings by etching from the surface except the bump portions.

7 Claims, 4 Drawing Sheets

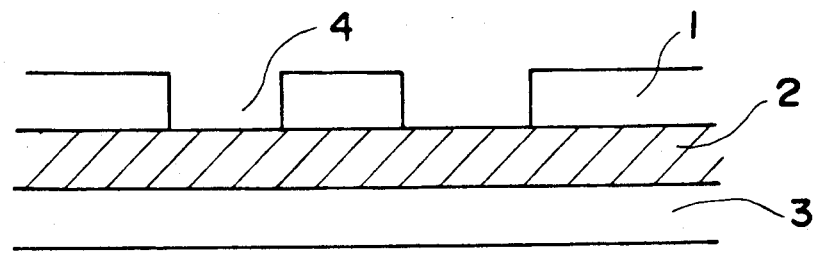
F I G. 1 (a)
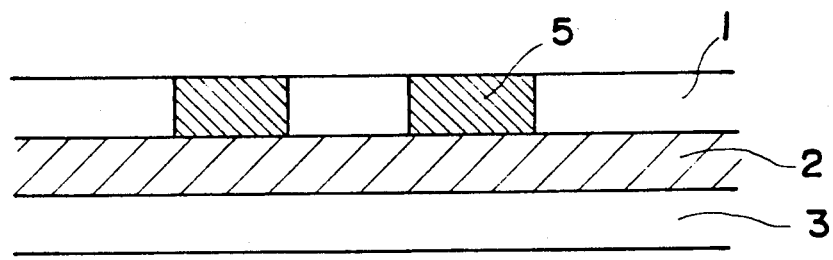
F I G. 1 (b)
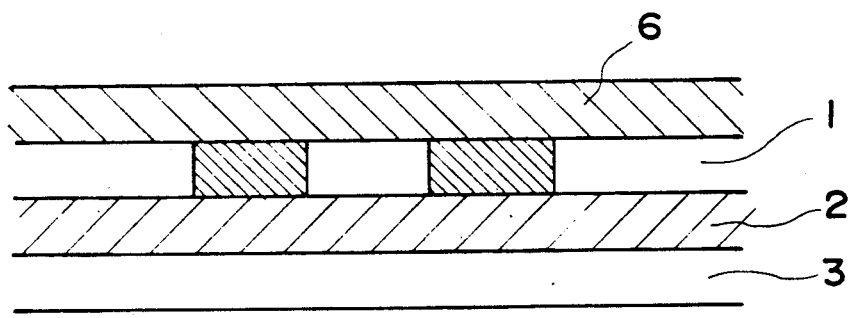
F I G. 1 (c)
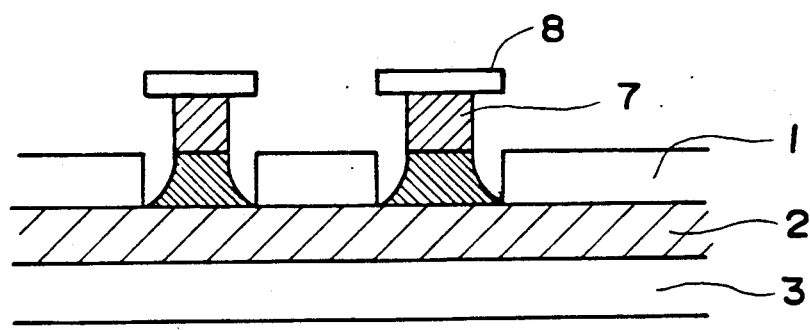
F I G. 1 (d)

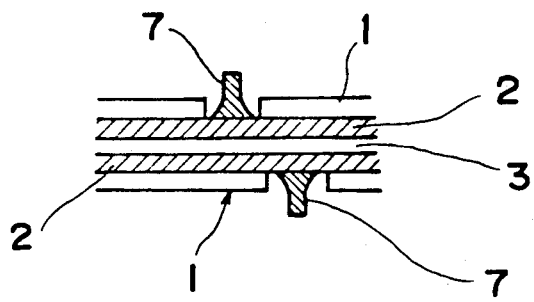
F I G. 6
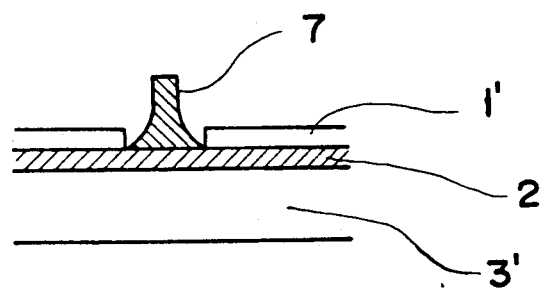
F I G. 7

PRINTED CIRCUIT BOARD HAVING BUMPS AND METHOD OF FORMING BUMPS

BACKGROUND OF THE INVENTION:

1. Field of the Invention

The present invention relates to a printed circuit board having bumps and to a method of forming the bumps that serve for connection terminals in the connection portions and land portions of the printed circuit board such as an FPC. More specifically, the invention relates to a printed circuit board having uniform and tall bumps and to a method of forming the bumps formed by applying a plating onto the printed circuit board up to the height of the bumps followed by etching the plating.

2. Prior Art

The FPC is usually coated with a cover lay film. However, in order to prevent the terminals for connection and the land portions for mounting parts to be covered with the cover lay film, holes are formed in such portions of the cover lay film in advance using a drill or a punch prior to applying the film. This, however, makes it difficult to achieve the contact with the circuit pattern of the opposite side unless bumps for connection are formed in portions corresponding to the holes by some means.

Method of forming bumps have been disclosed, for example, in Japanese Patent Laid-Open Nos. 98186/1988 and 152147/1982.

According to the method disclosed in Japanese Patent Laid-Open No. 98186/1988, a flux is supplied into through holes connected to conductors of the board circuit, a solder ball is adhered on each through hole and is melted to form a solder protuberance at an opening of the through hole.

According to the method disclosed in Japanese Patent Laid-Open No. 152147/1982, metallic protuberances are formed on the board such as of a glass and is then transferred onto metal leads of the FPC.

There has further been proposed a method according to which corresponding portions of the circuit pattern of FPC are pushed up from the back side using a pin-like jig in order to form bumps.

In the method of adhering the solder balls, however, apertures must be formed prior to forming the through holes. The aperture usually has a diameter of 0.4 mm at the smallest. Further, to place the solder ball thereon, the bump must have a diameter of about 1 mm. Even under optimum conditions, it is not possible to reduce the size of the bump to less than 250 $\mu$m in diameter. Because of this reason, this method could not be used for the FPC having fine patterns. It is further necessary to reliably place the solder ball on each through hole without deviation. Furthermore, the material of the bump is limited to the solder and the flux must be removed as well.

With the method of transferring metallic protuberances, it is difficult to form bumps having a height greater than 100 $\mu$m. When the metallic protuberances are formed with gold plating, furthermore, the manufacturing cost increases. Furthermore, this technology must form bumps on the finger portion of a flexible tape in the TAB system for mounting semi-conductor elements on the flexible tape. In the case of the FPC in which the circuit pattern is coated with a cover lay film, therefore, it is difficult to transfer the metallic protuberances onto predetermined positions of the FPC. In the case of large FPC's, in particular, this becomes more difficult due to dimensional changes. Furthermore, owing to the thickness of the resist and so on, the height of the protuberances is about 20 $\mu$m at the greatest.

With the method of pushing up the circuit pattern with a jig, furthermore, cracks develop when the circuit pattern is pushed up and reliability is lost. Furthermore, it only those bumps having a height smaller than the limit of plastic deformation of the Cu pattern that is are formed. In the case of the double-sided board having circuit pattern on both surfaces, it is not possible to arrange the Cu pattern on the back side of the bump-forming portion. This method, therefore, is used only for one-sided board. Further, it is not possible to reduce substantially the diameter of the pin that serves as a squeezing pin making it difficult to form bumps having diameters smaller than 250 $\mu$m. When the conductor patterns at the connection portions are arranged maintaining a small pitch, it also becomes difficult to arrange the pins for pushing up.

Another method consists of coating the board with a cover film except the portions for forming bumps, and depositing a plating on the portions where bumps are to be formed. By taking the bulge of the adhesive into consideration, however, the hole in the cover film corresponding to the bump-forming portion must have a diameter of at least 0.3 mm. Furthermore, the plating may grow laterally by the thickness of the plating causing the bump to assume the shape of a mushroom. Even with this method, therefore, the bump tends to have an increased size; at present, it is difficult to form bumps having diameters of smaller than 0.2 mm. It can further be thought to cover the board except the portions for forming bumps by stacking several resist layers such as dry films to a thickness of about 150 $\mu$m and then apply copper plating on the portions for forming bumps. However, the dry film has a thickness of 35 $\mu$m at the greatest, and it is virtually difficult to advance the process while stacking several such dry films.

SUMMARY OF THE INVENTION

In view of the problems inherent in the prior art, the object of the present invention is to provide a method of forming bumps having a height greater than 100 $\mu$m and a minimum diameter of about 100 $\mu$m without using any particular metal or mechanical processing but based simply upon a chemical processing which consists of plating and etching, as well as to provide an FPC having a function that can be connected to the circuit of the opposing side via bumps formed by this method.

In order to achieve the above object according to the present invention, a plurality of bumps that serve as connection terminals are formed on the printed circuit board by coating the printed circuit except the portions where the bumps are to be formed, electroplating the uncoated bump-forming portions on the printed circuit maintaining a thickness nearly equal to that of the coating, applying a non-electrolytic plating and an electroplating onto the entire surface from the surfaces of bump forming portions through up to the surfaces of coated portions, and then removing the plating by etching from the surfaces except the bumps.

The printed circuit board of the present invention has a plurality of bumps formed by this method, the bumps having nearly flat surfaces and an equal height and, further, having a large aspect ratio.

In the above-mentioned step, the etching is effected after the bump-forming portions only are covered with the resist by applying or laminating the resist on the plating that is deposited to a required height of bumps followed by the exposure to effect developing. After the plating is removed by etching except the bumps, nickel plating and gold plating are usually effected to cope with the corrosion.

The printed circuit board on which bumps are formed may be a rigid board or a flexible board, and further may be a one-sided board having a printed circuit on one surface only or a double-sided board having printed circuits on both surfaces.

The printed circuit is coated by a method according to which a cover lay film having holes in portions corresponding to bump-forming portions is stuck onto the circuit board, or by a method according to which a solder resist ink is applied to the portions other than the bump-forming portions.

Copper is usually used as a material for effecting the electroplating and non-electrolytic plating.

The etching is effected after the resist is applied to the bump-forming portions. This protecting film is formed, for example, by laminating a film-like photo-resist, and baking it with, the bump pattern mask using a UV exposing machine followed by developing.

In this process, the non-electrolytic plating is effected for forming a plated layer even on the coated portions. Therefore, a catalyst for non-electrolytic plating is imparted even onto the coating to effect the non-electrolytic plating. Thereafter, the electroplating is effected up to a desired height of the bumps. Prior to effecting the non-electrolytic plating, the bump-forming portions are flattened being buried by the electroplating of a thickness equal to that of the coating. Therefore, the plated layer of a height of the bumps has a flat surface without ruggedness.

In the subsequent etching operation, use is made of a photomask having a desired bump pattern during the exposure, and then the time for etching is adjusted to form a plurality of bumps having a desired diameter at one time.

The height of the bumps is controlled to any desired value by adjusting the time for electroplating after the non-electrolytic plating. Further, the height of bumps varies depending upon the degree of flatness on the plated layer that has the height of the bumps to be formed. Variance in the height can be suppressed to be, for example, within ±12 μm.

The thus formed bumps have flat surfaces that are nearly flush with each other, have a large aspect ratio, and have side walls of a J shape in vertical cross section. Furthermore, the diameter of bumps and the interval for arranging the bumps can be easily selected depending upon the fineness of the circuit pattern. Therefore, the printed circuit board having bumps is connected via bumps to a circuit having a fine pattern of the opposing side maintained very high reliability in contact.

According to the present invention, the plating layer is formed maintaining a height that corresponds to the height of the bumps and is then subjected to the etching to form bumps. Therefore, the aforementioned problems inherent in the prior art such as height and pitch of the bumps, reliability, and problems in the fabrication steps are all solved, that is, the height and diameter of the bumps can be easily controlled. For instance, the bumps having a height of 120 μm and a diameter of 100 to 220 μm in the upper portion thereof can be easily formed at one time. Moreover, variance in the height can be suppressed within ±12 μm, enabling the pitch to be shortened relative to the neighboring bumps and reliability in contact to be improved at the time of connection.

Therefore, bumps can be easily formed, for example, maintaining a pitch of 1.4 mm, having a diameter of 200 μm and a height of 140 μm from the coating to meet in the modern requirement for producing electronic parts in reduced sizes.

As required, furthermore, the surfaces of the bumps can be finished to be smooth or rugged by changing the plating bath. By selecting the plating bath, furthermore, it is possible to plate hard nickel, hard gold, soft nickel or soft gold onto the surfaces of the bumps. Depending upon the cases, the solder plating may be applied. Therefore, the method of connecting the printed circuit board having bumps can be selected over a wide range to easily cope with heat-adhesion, soldering, mechanical contact and so on.

As described above, furthermore, the size of the bumps can be easily controlled. When arranged maintaining a pitch of 1.8 mm, for example, the bumps may have a height of 140 μm and a diameter of 100 to 200 μm.

BRIEF DESCRIPTION OF THE DRAWINGS

FIGS. 1(a) to 1(d) are section views illustrating a method of forming bumps according to an embodiment of the present invention;

FIG. 6 is a section view showing the structure of a double-sided FPC in which bumps are formed on both surfaces according to the method of the present invention; and FIG. 7 is a section view showing a bump formed on a rigid board according to the method of the present invention.

DESCRIPTION OF THE PREFERRED EMBODIMENTS

The embodiments of the present invention will now be described in conjunction with the drawings.

Figure 2:
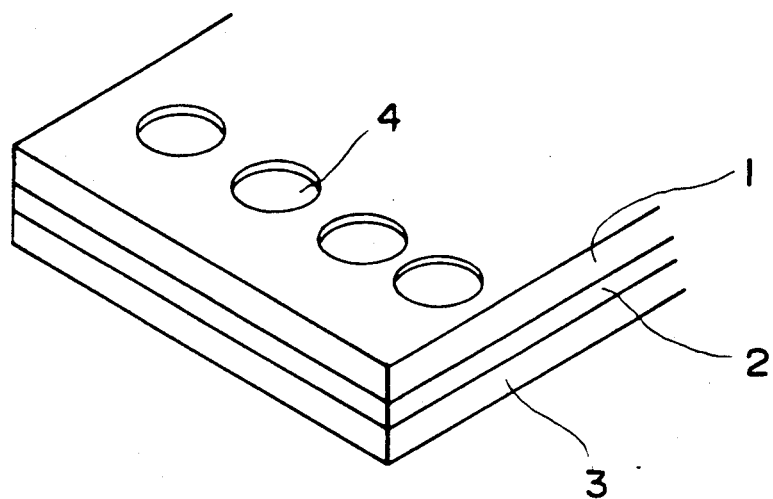
FIG. 2 is a perspective view illustrating the condition where the FPC is applied to form bumps according to the method of FIG. 1.

FIGS. 1(a) to 1(d) are section views illustrating a method of forming bumps according to an embodiment of the present invention. Referring to FIG. 1(a), a cover film 1 having holes formed by a drill or a punch at portions corresponding to the portions for forming bumps is stuck to a base film 3 (FPC) on which a copper-foil circuit pattern 2 is formed to cover the circuit pattern 2. FIG. 2 is a section view showing the covered condition. The base film 3 consists of a polyimide film having a thickness of 25 μm and an adhesive layer having a thickness of 25 μm on which is adhered the copper foil that forms the circuit pattern 2. The copper foil forming the circuit pattern 2 has a thickness of from 18 to 60 μm. The cover lay film 1 consists of a polyimide resin having a thickness of 25 μm, and is adhered onto the circuit pattern 2 and onto the base film 3 via an adhesive layer which is 25 μm thick.

Next, copper is electroplated onto the holes of the cover lay film 1, i.e., onto portions 4 of the circuit pattern 2 that are not covered. If there are portions of the circuit pattern 2 that are not covered but are exposed in addition to the bump-forming portions, such portions are masked in advance. The copper plating is effected up to the height of the upper surface of the cover lay film 1 as shown in FIG. 1(b), so that the upper surface of the cover lay film 1 and the upper surface of the copper plating 5 become flush with each other to form a flat surface. This enables the subsequent plating to be uniformly effected over the entire surface without causing upper portions of the holes 4 to be recessed, and further enables the resist to be properly applied prior to effecting the etching.

After the holes 4 are plated with copper, a catalyst adapted to non electrolytic plating is applied to the entire surface and copper is plated non-electrolytically. This makes it possible to electrically plate copper even onto the cover lay film 1 as will be described later. When the bumps are to be formed on one surface only of the board, the other surface may have been covered with a film or the like such that the non-electrolytic plating is effected onto one surface only.

Next, referring to FIG. 1(c), copper is electrically plated on the non-electrolytically plated cover as designated at 6 maintaining a thickness of, for example, 120 μm to reach the height of the bumps that are to be formed. Bright dipping may be used depending upon the material of the conductor of the opposite side to which the bumps come into contact.

Then, a dry film or a liquid resist is laminated or is applied thereon, the resist is baked with a bump pattern by exposure followed by developing, and copper is removed by etching from the surfaces except the bumps 7 as shown in FIG. 1(d) where reference numeral 8 denotes a resist portion corresponding to the bump pattern left after developing. In this case, the etching time must be so controlled that the circuit pattern 2 is not removed by etching. For the purpose of safeguard, furthermore, gold may be plated on the circuit pattern 2 prior to plating copper on the holes 4 in the above-mentioned step, such that the circuit pattern 2 is protected by the gold plating from the over-etching.

Next, the resist 8 is removed, nickel is plated as an underlying layer on the bumps 7 maintaining a thickness of 1 to 4 μm, followed by the plating of gold maintaining a thickness of 0.01 to 0.5 μm to impact resistance against corrosion. Formation of the bumps 7 is thus completed.

The aforementioned steps are not effected for each of the FPC's; i.e., a plurality of FPC's are attached to a sheet of, for example, 480×300 mm and are subjected to the above steps.

Described below is another embodiment of the present invention.

Figures 3A, 3B, 3C:
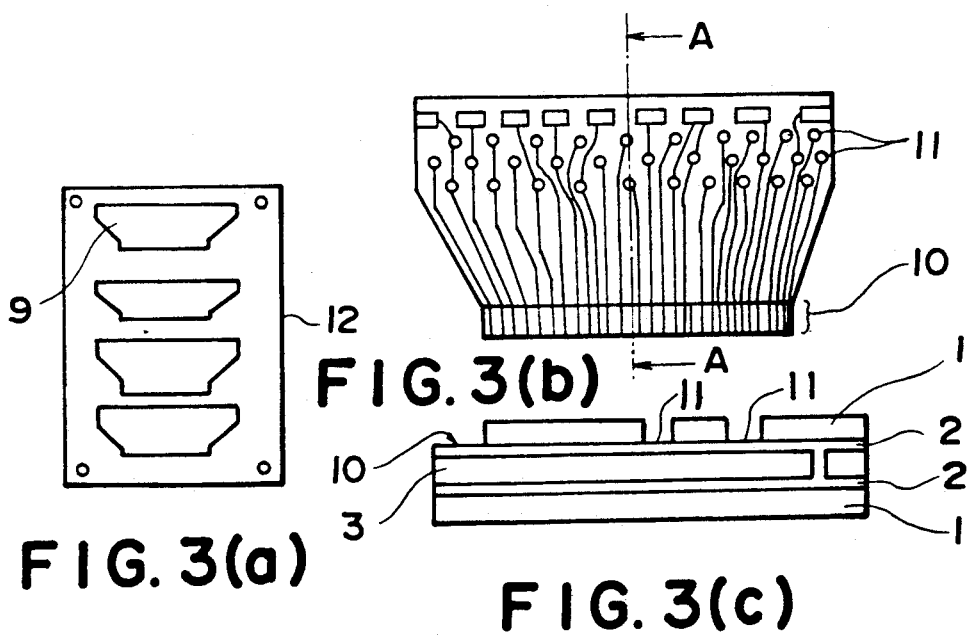
FIG. 3(a) is a plan view showing a sheet-like FPC.
FIG. 3(b) is a plan view showing an FPC on an enlarged scale.
FIG. 3(c) is a section view along the line A—A of FIG. 3(b)

FIG. 3(a) shows a sheet-like FPC which includes four FPC's 9, FIG. 3(b) is a plan view which illustrates an FPC on an enlarged scale, and FIG. 1(c) is a section view along the line A—A of FIG. 1(b).

As shown in these drawings, plating is applied to through holes in a double-sided board which consists of a 25 μm-thick polyimide film 3 as a base with a 35 μm-thick rolled copper foil laminated on both surfaces thereof, a circuit pattern 2 is formed by the patterning based on an ordinary etching process, a cover lay film 1 consisting of a 25 μm-thick polyimide is hot-pressed to obtain an FPC sheet (240×330 mm) 12 which is covered except the terminal portions 10 and the pad portions 11, and bumps are formed on the pad portions 11.

First, copper is plated maintaining a thickness of 50 μm on the uncovered pad portions 11 on the circuit pattern 2, so that its upper surface becomes the same as the upper surface of the cover lay film 1. Here, use is made of a plating bath having good smoothness without containing a brightening agent.

Then, after the non electrolytic plating is effected in the same manner as in the aforementioned embodiment, copper is electroplated up to a thickness of 120 μm using a gloss plating bath of copper sulfate at a current density of 4 A/dm$^2$ for 120 minutes.

Next, the dry film is laminated followed by exposure and developing in order to form a bump pattern on the bump-forming portion. The bump image of a photomask for exposure used here has a diameter of 400 μm, such that the bumps will have a diameter of 200 μm in the upper portion thereof by taking the over-etching into consideration. Furthermore, the dry film has a thickness of 1.5 mil such that the resist will not be peeled off even when the etching is effected for an extended period of time.

Figure 4:
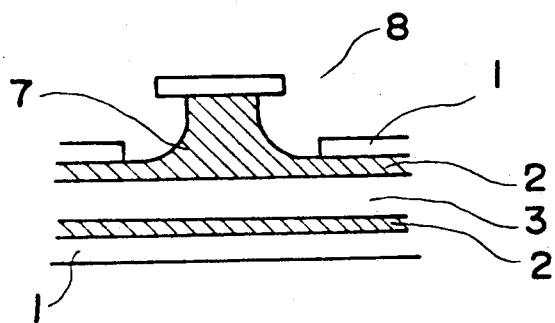
FIG. 4 is a section view of a bump formed according to another embodiment of the present invention.

Then, the etching is effected to form bumps 7 as shown in FIG. 4. The etching time is determined in advance through the testing using a dummy board to avoid over-etching.

Thereafter, the resist 8 is removed from the bumps, nickel (soft nickel) is plated onto the bumps maintaining a thickness of 4 μm, and gold (soft gold) is plated thereon maintaining a thickness of 0.5 μm to complete the formation of bumps.

Figure 5:
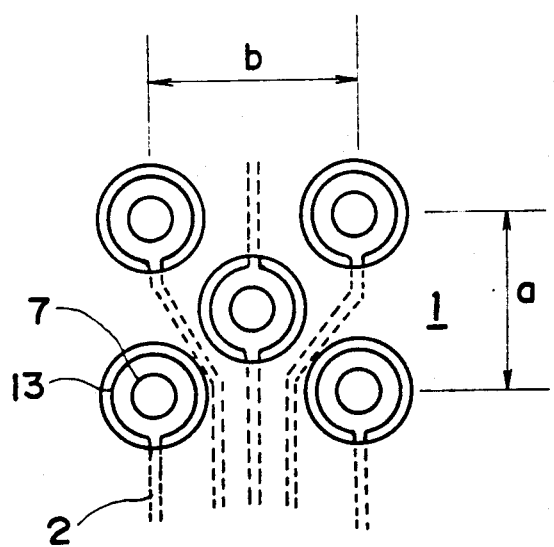
FIG. 5 is a plan view showing some of the plurality of bumps formed according to another embodiment of the present invention.

FIG. 5 is a plan view of bump portions thus formed on the FPC, wherein reference numeral 1 denotes a cover layer film, 2 denotes a circuit pattern, 7 denotes bumps and 13 denotes land portions. Sizes of the thus formed bumps are measured; i.e., the diameter is 210 μm in average and the height is 115 μm in average. The land portion has a diameter of 0.8 mm and the cover lay film has openings with a diameter of 0.9 mm. The pitch a among the bumps is 1.27 mm and the pitch b is 2.54 mm.

Though the aforementioned embodiment has dealt with the case where the bumps were formed on the one-sided FPC, it is also possible to form bumps on the double-sided FPC and on a hard and rigid board. FIG. 6 is a section view showing the constitution of the double-sided FPC having bumps formed on both surfaces thereof.

In the case of the rigid board, solder resist ink is applied, instead of the cover lay film, onto the surface except the terminal portions or the pad portions, and the plated layer is formed in the same manner as described above, and then the bumps are formed by etching.

FIG. 7 is a section view of the bump 7 formed on the rigid board as described above, and wherein reference numeral 1' denotes a solder resist ink applied onto the printed circuit 2, and reference numeral 3' denotes a glass epoxy board on which the printed circuit 2 is formed.

What is claimed is:

1. A method of forming bumps which serve for connecting terminals on a printed circuit board consisting of the steps of:
   a) forming a circuit pattern (s) on a base film (3) and covering the circuit pattern with a cover film (1), said cover film having holes in the portions corresponding to the portions (4) where bumps are to be formed;
   b) electroplating said holes of said cover film up to the height of the upper surface of said cover film whereby the upper surface of the electroplating (5) is flush with the upper surface of said cover film;
   c) applying a non-electrolytic plating and an electroplating onto the entire surface of said cover film whereby an electric plating (6) on said cover film is obtained;
   d) removing the plating by etching except the bump-forming portions whereby bumps are obtained.

2. The method according to claim 1 wherein a resist (8) is laminated onto said bumps, followed by exposure and development.

3. The method according to claim 1 wherein nickel and gold are plated on the bump portions to impart resistance against corrosion after the plating is remove by etching.

4. The method according to claim 1 wherein the bumps have a height greater than 100 $\mu$m and a diameter of at least 100 $\mu$m.

5. The method according to claim 1 wherein the board has two surfaces and the board has a printed circuit only on one surface thereof.

6. The method according to claim 1 wherein the board has two surfaces and the board has a printed circuit on both surfaces and the bumps are formed on both surfaces.

7. The method according to claim 1 wherein said bumps have a height greater than said cover film.

* * * * *